(12) United States Patent
Lopes et al.

(10) Patent No.: US 6,879,147 B2
(45) Date of Patent: Apr. 12, 2005

(54) PACKAGE WITH ENVIRONMENTAL CONTROL MATERIAL CARRIER

(75) Inventors: Vincent C. Lopes, Lucas, TX (US); Jwei Wien Liu, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/674,829

(22) Filed: Sep. 30, 2003

(65) Prior Publication Data

US 2004/0061492 A1 Apr. 1, 2004

Related U.S. Application Data

(62) Division of application No. 09/992,178, filed on Nov. 5, 2001, now Pat. No. 6,664,779.
(60) Provisional application No. 60/249,150, filed on Nov. 16, 2000.

(51) Int. Cl.[7] .............................................. G01R 31/302
(52) U.S. Cl. .................... 324/158.1; 324/751; 324/752; 324/753
(58) Field of Search ............................. 324/158.1, 751, 324/752, 753, 754, 755, 71.3, 97, 759, 763, 764, 765

(56) References Cited

U.S. PATENT DOCUMENTS

| 5,331,454 A | 7/1994 | Hornbeck |
| 5,517,347 A * | 5/1996 | Sampsell .................... 359/224 |
| 5,640,479 A * | 6/1997 | Hegg et al. .................. 385/120 |
| 6,024,801 A | 2/2000 | Wallace et al. |
| 6,242,165 B1 | 6/2001 | Vaartstra |
| 2002/0056560 A1 | 5/2002 | Liu |
| 2002/0056900 A1 | 5/2002 | Liu et al. |

* cited by examiner

*Primary Examiner*—Luan Thai
*Assistant Examiner*—Trung Q. Nguyen
(74) *Attorney, Agent, or Firm*—Charles A. Brill; Wade James Brady, III; Frederick J. Telecky, Jr.

(57) ABSTRACT

A drop-in environmental control material carrier assembly 55, which improves the performance and lowers the cost of semiconductor packages. The disclosed approach positions the environmental control materials inside the package cavity by means of a drop-in environmental control material carrier assembly 54, which can hold up to eight materials. In the case of a packaged micromirror, the getters consist of at least three types; i.e., (1) one for absorbing moisture inside the package, (2) one for absorbing adhesive outgassing constituents inside the package, and (3) one for storing the PFDA lubricant used to prevent the micromirror mirrors from sticking. The performance and lifetime of the micromirror devices are improved and the cost of projection display systems, in which these micromirrors are central components, is lowered. The preceding abstract is submitted with the understanding that it only will be used to assist in determining, from a cursory inspection, the nature and gist of the technical disclosure as described in 37 C.F.R. § 1.72(b). In no case should this abstract be used for interpreting the scope of any patent claims.

5 Claims, 4 Drawing Sheets

PACKAGE WITH ENVIRONMENTAL CONTROL MATERIAL CARRIER

CROSS-REFERENCE TO RELATED APPLICATIONS

This application is a Divisional of application Ser. No. 09/992,178, filed Nov. 5, 2001 now U.S. Pat. No. 6,664,779, and Provisional Application No. 60/249,150, filed Nov. 16, 2000.

This invention is related to concurrently filed U.S. Patent Applications bearing U.S. Ser. No. 09/990,952 entitled "Electro-Optical Package with Drop-in Aperture," U.S. Ser. No. 09/991,446, entitled "Enclosure for MEMS Device," and U.S. Pat. No. 5,331,454 titled "Low Reset Voltage Process for DMD," the contents of which are hereby incorporated by reference in this application.

BACKGROUND OF THE INVENTION

1. Field of the Invention

The present invention relates to the packaging of semiconductor devices and particularly to that of micromechanical devices.

2. Description of the Related Art

Packaging is a critical part of producing high-performance semiconductor devices, particularly microelectrical mechanical systems (MEMS) such as micromirror devices. Environment is a critical parameter for most semiconductor chips. For example, in a micromirror device, which is a particular variety of spatial light modulator, the mirrors land on the substrate surface of the device. In order to avoid the mirrors from sticking, it is necessary that the micromirror device is lubricated and packaged in an environment with minimal amounts of moisture, adhesives, dust, and other contaminants. It is shown in U.S. Pat. No. 5,331,454, titled "Low Reset Voltage Process for DMD," that lubrication of the surface of the micromirrors landing electrodes with an oriented monolayer, such as Perfluordecanoic Acid (PFDA), can decrease the Van der Waals forces and thereby reduce the tendency for the mirrors to stick to the landing electrodes. It is also Know that water of the surface of the micromirror increases the tendency of the mirrors to stick.

The packaging of micromirror chips for use in protection displays and other electro-optical applications has continued to present a cost barrier that contributes to higher priced projection display products. These packages are not only expensive, but also require a low throughput process that increases the product cycle time, thereby further driving up the cost.

FIG. 1 shows a typical micromirror package. In the past, this has often been a hermetic package, although lower-cost plastic packages have been disclosed.

The illustrated package is comprised of a ceramic case 10 and an optical cover glass (lid) 11. The cover glass 11 has an aperture 110 through a light shield 120 deposited on the bottom side of the cover 11. The cover 11 is attached to the package case 10 by either welding or adhesive techniques. The primary purpose of the light shield 120 is to prevent stray light from reaching the bond wires and bond pads around the peripheral of the micromirror. These regions reflect stray light reaching them and the reflected light enters the projection optics of the display system, lowering the contrast ratio of the projected image. Packages housing non-electro-optical devices use opaque top covers 11.

The environment inside these chip packages can be largely controlled by means of getters. FIG. 2 shows a micromirror package's top cover 20 with getter material 21 attached to the bottom surface to absorb moisture inside the package. The getter strips 21 are attached to the cover 20 with an adhesive 22.

There is a need for an improved method of placing and holding a getter and other environmental control materials in a semiconductor package. The invention disclosed herein addresses these needs by moving the getter from the package cover and providing a low-cost drop-in environmental control material carrier assembly, which holds various kinds of environmental control materials material.

SUMMARY OF THE INVENTION

This invention discloses an improved semiconductor package with a drop-in environmental control material carrier assembly that provides higher-performance, lower-cost, and longer-life devices. The disclosed approach separates the getter material from the package's top cover and positions it in the package's cavity by means of a drop-in environmental control material carrier assembly.

The environmental control material carrier assembly can hold various types of material and is in thermal contact with the package substrate walls. For example, in the case where the chip is a micromirror device, the frame will typically hold three types of materials; (1) a desiccant for absorbing moisture, (2) a getter for absorbing adhesive outgassing constituents, and (3) a reservoir of PFDA lubricant. This provides higher environmental control material capacity which results in overall higher performance and longer life micromirror devices.

Potential advantages provided by the disclosed invention may include:
1. the package is made up of lower cost piece parts
2. offers multi-material functionality (moisture absorption, adhesive outgassing absorption, and lubricant storage) capability,
3. provides higher environmental control material capacity, and
4. provides an easier assembly process which results in lower cost devices.

DESCRIPTION OF THE VIEWS OF THE DRAWINGS

The included drawings are as follows:

FIG. 3b is a drawing showing the mesh structures that hold the environmental control materials in the carrier assembly of FIG. 3a.

DETAILED DESCRIPTION

This invention discloses an improved semiconductor package with a drop-in environmental control material carrier assembly that provides higher-performance, lower-cost, and longer-life devices. The disclosed approach separates the environmental control material from the package's top cover and positions it in the package's cavity by means of a drop-in environmental control material carrier assembly. The approach of this invention increases the lifetime of a micromirror device, packaged in a non-hermetically sealed package, by increasing the moisture and adhesive outgassing absorption capacity and simultaneously lubricating the micromirror superstructure. The net result of this approach is overall higher performance and longer lifetime micromirrors.

The carrier assembly of this invention can hold various combinations of environmental control material, for example; (1) a desiccant for absorbing moisture, (2) a desiccant for absorbing adhesive outgassing constituents, and (3) a lubricant reservoir in a micromirror package.

Removing the environmental control material from the cover glass frees up space to provide a wider epoxy bond seal where the glass cover attaches to the package substrate walls, thereby decreasing the package's permeability and extending the device's life cycle.

Figure 1:
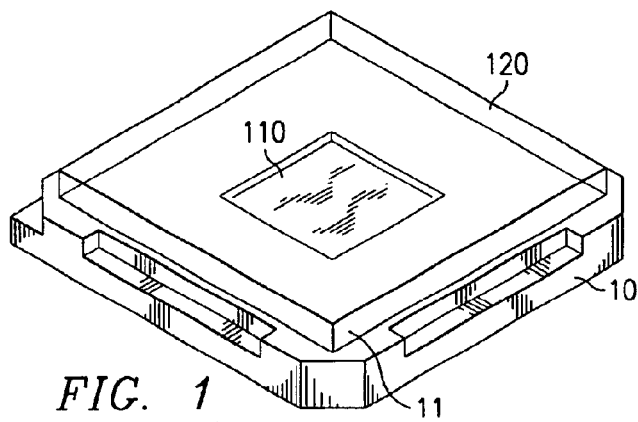
FIG. 1 is a drawing of a conventional micromirror package of the prior art having a glass cover with deposited metal light shield and etched aperture.
Figure 2:
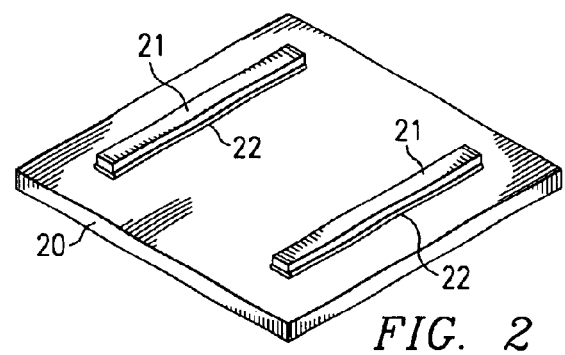
FIG. 2 is a drawing showing a prior art getter attached to the underside of the package's top cover with an adhesive.
Figure 3A:
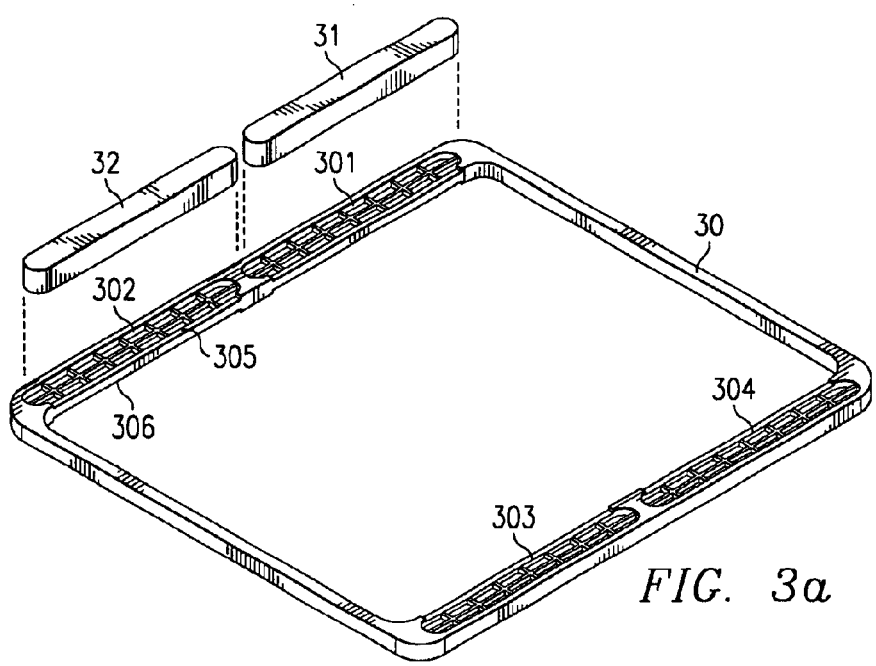
FIG. 3a is a drawing of the drop-in environmental control material carrier assembly according to one embodiment of this invention.

FIG. 3a is a drawing of the drop-in environmental control material carrier assembly 30 of this invention. The carrier assembly is sized to drop into the cavity of a particular semiconductor package. The frame has four slots 301–304, as shown, although additional slots could be added if required. The environmental control material 31, 32 is held in the slots 301–304. In general, there could be additional materials of various types in the frame 30. In the particular case of a micromirror package, half of these (for example, slots 301 and 303) typically hold desiccants to absorb moisture and/or adhesive outgassing constituents and the remaining slots (302 and 304) hold PFDA lubricant reservoirs. The inside walls of the frame 30 are cut down at both the top 305 and bottom 306 of each slot to provide a transportation path for the traces of lubricant and/or moisture to and from the micromirror, respectively.

Figure 3B:
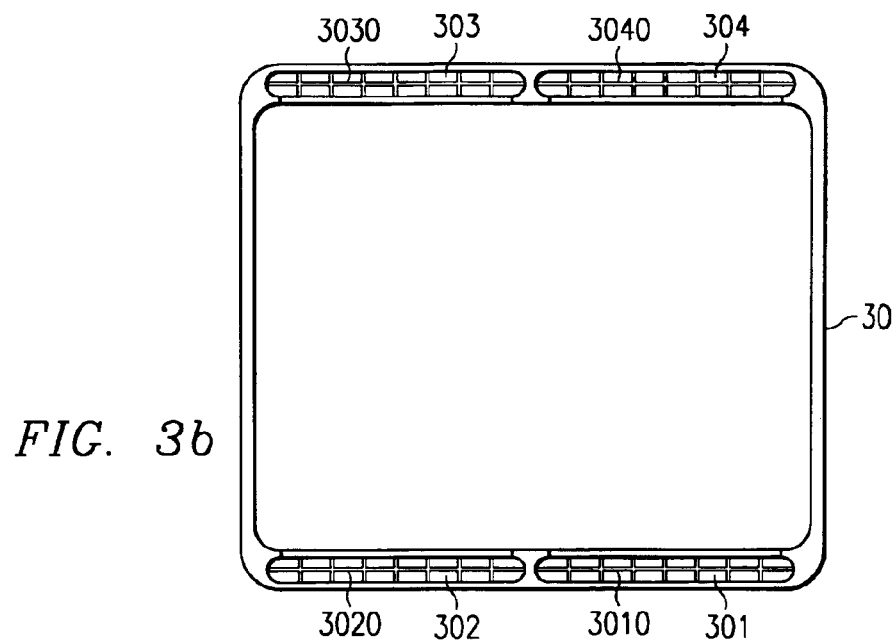
Figure 3C:
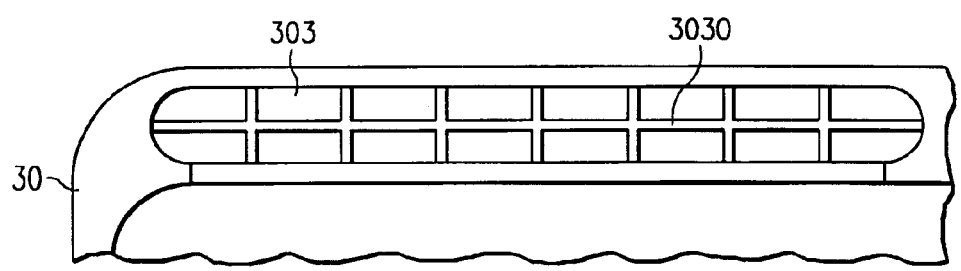
FIG. 3c is an exploded view of the mesh pattern of FIG. 3b.

FIG. 3b shows an exploded view of the slots 301–304. These slots contain mesh structures 3010–3040, which are used to hold the getters in place. FIG. 3c shows slot 303 with its mesh 3030 on a larger scale.

Figure 4:
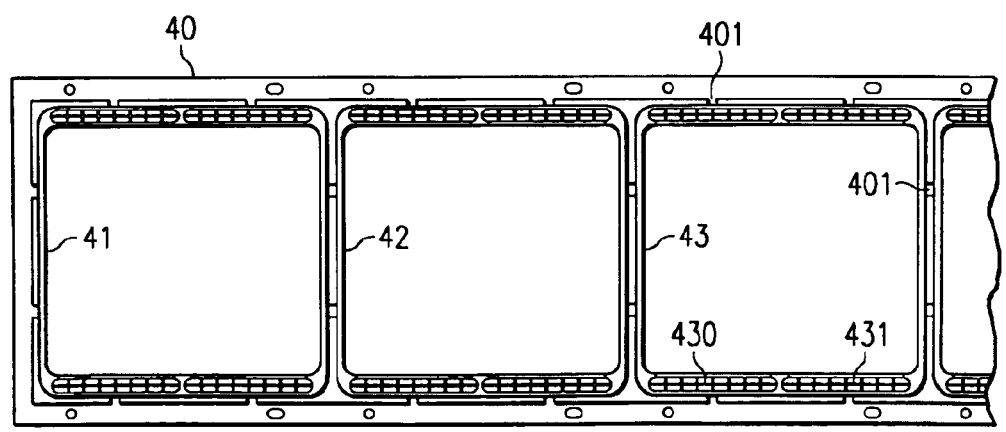
FIG. 4 is a drawing of a low-cost lead-frame used in providing the drop-in environmental control material carrier assembly of this invention.

FIG. 4 is a drawing showing one example of how the carrier assembly is fabricated in large quantities on lead-frames 40 to provide an effective, low-cost getter approach. The lead-frame 40 will contain several carrier assemblies 41–43 (three shown). Each carrier assembly is attached by means of tabs 401, which are cut to remove the piece-parts from the lead-frame 40. Each carrier assembly contains the appropriate number of slots 430–431 (two labeled), each with the built-in mesh to hold the environmental control material in place.

Figure 5:
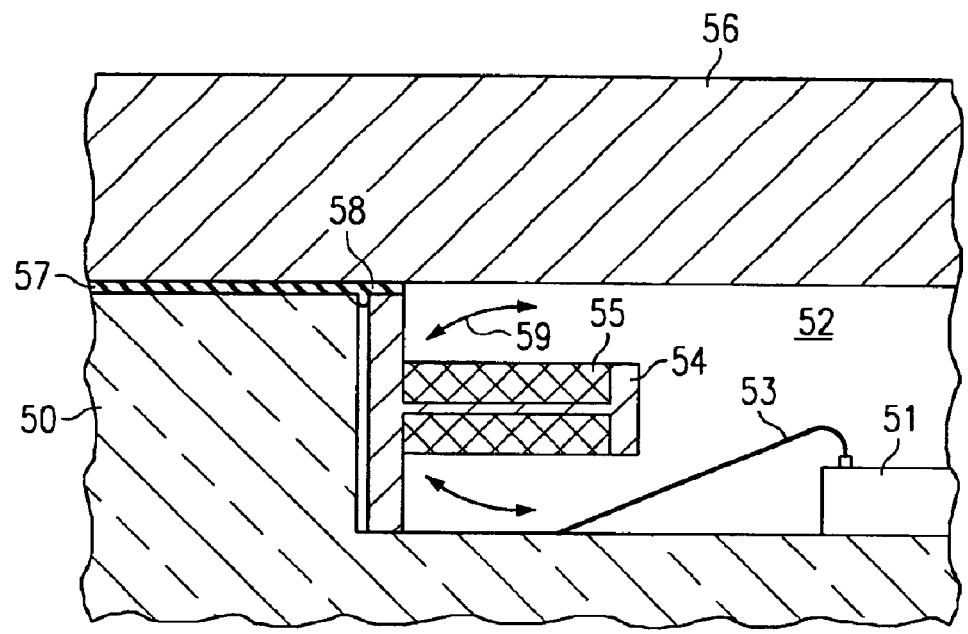
FIG. 5 is a cross-sectional drawing showing an example of a semiconductor package containing the drop-in environmental control material carrier assembly of this invention.

FIG. 5 is a cross-section of a semiconductor package outfitted with the carrier assembly of this invention. The package is comprised of a substrate 50 with chip cavity 52, a semiconductor chip 51, bonding wires 53, the carrier assembly 54 and environmental control materials 55 of this invention, and a top cover 56. An adhesive 58 typically is used to mount the carrier assembly in place inside the package cavity 52, providing a thermal path between the carrier assembly 54 and package substrate 50. Additionally, an adhesive 57 typically is used to attach the top cover 56 to the molded package (substrate and case) 50. The inside walls of the carrier assembly 54 are shown cut down in the areas of the carrier assembly slots to provide a path 59 above and below the carrier assembly for the appropriate gasses to flow.

Figure 6:
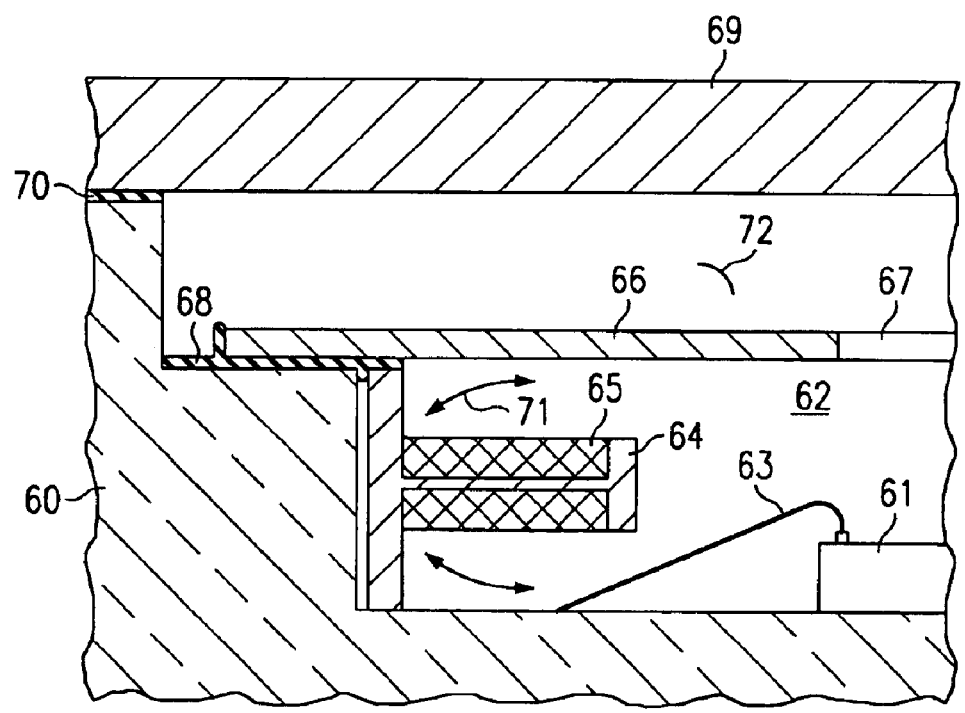
FIG. 6 is a cross-sectional drawing showing an example of a micromirror package, which contains both the drop-in environmental control material carrier assembly of this invention and a drop-in aperture.

FIG. 6 is a cross-sectional drawing of a package outfitted with the drop-in environmental control material carrier assembly of this invention, where the chip 61 is a micromirror device and the package's top lid 69 is a glass cover. In this case the carrier assembly can be fitted with a combination environmental control materials 65, often up to eight material deposits, comprised of those that store PFDA lubricant and those that absorb moisture and/or adhesive outgassing constituents. The package is comprised of a substrate 60, a micromirror chip 61 mounted in the cavity 62 of the package, bond wires 63, the drop in carrier assembly 64 and materials 65 of this invention, a drop-in aperture 66 with aperture opening 67 of cross-referenced patent application TI-26268, and a top cover glass 69. Both the drop-in environmental control material carrier assembly 64 and drop-in aperture 66 are attached to the package substrate 60 with an adhesive 68. The cover glass 69 is also attached to the package with an adhesive 70. Since the environmental control materials are no longer mounted on the cover glass 69, there is room to make the adhesive surface 70 wider, thereby improving the resistance of the package to moisture. This view shows the gap 71 between the drop in aperture 66 and the cover glass 69, which can be made large by adjusting the height of the package wall to move the glass cover out of the plane of the micromirror. Since the cover is not near the plane of the micromirror, optical defects in the cover are less likely to be visible in the projected image. Also shown is the open path 71, for gasses and moisture to flow to and from the micromirror, where some of the environmental control materials absorb moisture and adhesive outgassing and others supply lubrication to the micromirror superstructure, thereby preventing sticking of mirrors.

Figure 7:
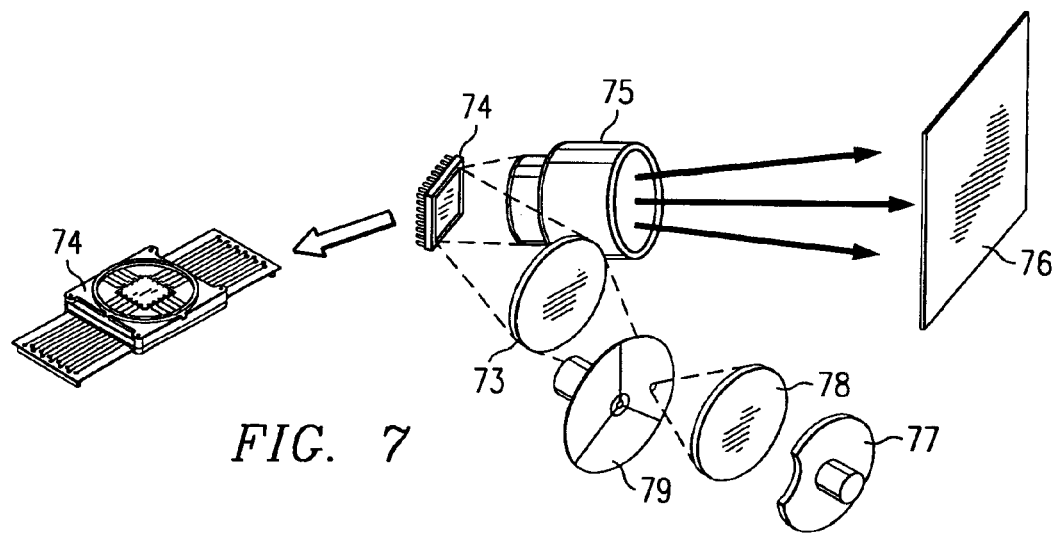
FIG. 7 is block diagram of a single-micromirror projection system using the improved micromirror package, with drop-in environmental control material carrier assembly, of this invention.

FIG. 7 is a system level block diagram for a single-micromirror projection display system, which uses the improved micromirror package of this invention. The system is comprised of a light source 70, a first condenser lens 71, a motor/color filter wheel assembly 72, a second condenser lens 73, a micromirror 74 in the improved package of this invention with drop-in environmental control material carrier assembly and optionally a drop-in aperture, a projection lens 75, and a viewing screen 76.

Figure 8:
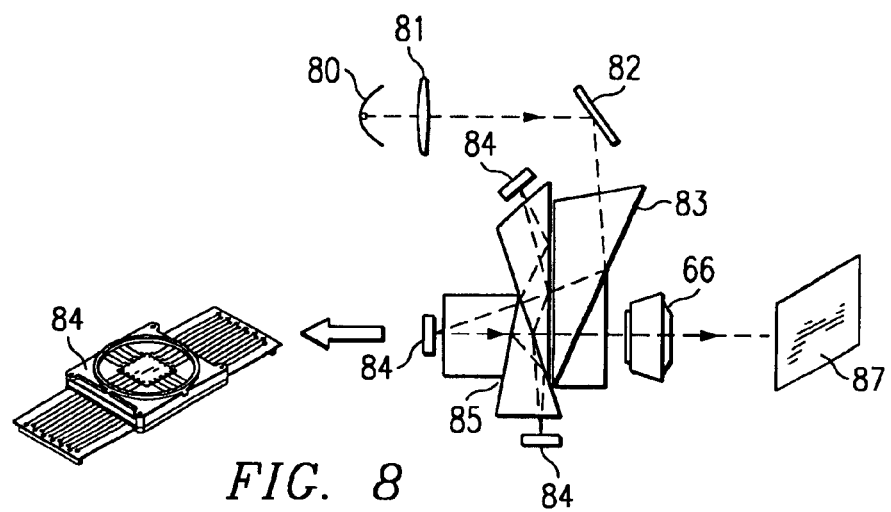
FIG. 8 is a block diagram of a high-brightness, three micromirror projection display system using the improved micromirror package, with drop-in environmental control material carrier assembly, of this invention.

Another example including a high-brightness micromirror projection display, which uses three micromirrors in the improved packages of this invention, is shown in FIG. 8. This system is comprised of a lamp (light source) and reflector assembly 80, a condenser lens 81, a turning mirror 82, a total internal reflective prism 83, three micromirrors 84 (for red, green, and blue light) in the package of this invention with drop-in environmental control material carrier assembly and optionally a drop-in aperture, color splitting/color combining prisms 85, a projection lens 86, and a viewing screen 87.

The improvements to the MEMS package of this invention considerably enhance the performance and lifetime and lowers the cost of such projection display systems. Some of the features potentially, but not necessarily provided by the disclosed invention are;

1. simpler package cover design,
2. improved cover alignment tolerance,
3. drop-in environmental control material carrier assembly holds various types of getter material, such as moisture absorption, adhesive outgassing absorption, and PFDA lubricant storage,
4. higher environmental control material capacity,
5. increased glass to substrate adhesive bond line width to increase moisture resistance, and
6. one size carrier assembly fits multiple packages, lowering inventory requirements and package cost.

While this invention has been described in the context of preferred embodiments, it will be apparent to those skilled in the art that the present invention may be modified in numerous ways and may assume embodiments other than that specifically set out and described above. Accordingly, it is intended by the appended claims to cover all modifications of the invention that fall within the true spirit and scope of the invention.

What is claimed is:

1. A micromirror projection display comprising:
   a light source for producing a beam of light traveling along a light path;
   a micromirror for selectively modulating said beam of light, said micromirror mounted on said light bath in a package with a transparent window and a carrier assembly holding at least one environmental control material; and
   a projection lens focusing said selectively modulated beam of light onto an image plane.

2. The micromirror projection display of claim 1, said environmental control material comprising at least one environmental control material selected from the group consisting of water absorbing desiccants, adhesive outgassing desiccants, and lubricant storage reservoirs.

3. The micromirror projection display of claim 1, said environmental control material comprising a desiccant for collecting moisture in said micromirror package.

4. The micromirror projection display of claim 1, said environmental control material comprising a desiccant for collecting outgassed matter in said micromirror package.

5. The micromirror projection display of claim 1, said environmental control material comprising a lubricant reservoir providing lubricant to said micromirror.

* * * * *